United States Patent
Sternowski

(10) Patent No.: US 11,421,945 B1
(45) Date of Patent: Aug. 23, 2022

(54) HEAT DISSIPATION SYSTEM WITH CROSS-CONNECTED HEATSINK

(71) Applicant: Softronics, Ltd., Marion, IA (US)

(72) Inventor: Robert H. Sternowski, Cedar Rapids, IA (US)

(73) Assignee: SOFTRONICS, LTD., Marion, IA (US)

( * ) Notice: Subject to any disclaimer, the term of this patent is extended or adjusted under 35 U.S.C. 154(b) by 0 days.

(21) Appl. No.: 16/911,956

(22) Filed: Jun. 25, 2020

(51) Int. Cl.
*F28F 7/00* (2006.01)
*F28F 3/02* (2006.01)
*F28D 21/00* (2006.01)
*F28F 21/08* (2006.01)

(52) U.S. Cl.
CPC ...... *F28F 3/025* (2013.01); *F28D 2021/0029* (2013.01); *F28F 21/085* (2013.01)

(58) Field of Classification Search
CPC .. F28F 3/025; F28F 21/085; F28D 2021/0029
USPC ....................................................... 165/80.3
See application file for complete search history.

(56) References Cited

U.S. PATENT DOCUMENTS

| | | | | |
|---|---|---|---|---|
| 5,381,859 | A * | 1/1995 | Minakami | F28D 15/0275 174/16.3 |
| 7,545,642 | B2 * | 6/2009 | Uehara | H02K 5/207 310/58 |
| 10,103,081 | B2 * | 10/2018 | Bharadwaj | H01L 23/34 |
| 10,103,089 | B2 * | 10/2018 | Kaslusky | H01L 23/467 |
| 10,727,023 | B2 * | 7/2020 | Parker | H01J 35/12 |
| 2003/0150597 | A1 * | 8/2003 | Lin | H01L 23/467 165/185 |
| 2004/0244947 | A1 * | 12/2004 | Chen | F28F 13/06 257/E23.099 |
| 2005/0145366 | A1 * | 7/2005 | Erel | H01L 23/467 257/E23.099 |
| 2006/0011324 | A1 * | 1/2006 | Rogers | H01L 23/467 165/80.3 |
| 2006/0011325 | A1 * | 1/2006 | Schlitz | H01L 23/367 165/80.3 |
| 2006/0021735 | A1 * | 2/2006 | Lopatinsky | H01L 23/467 165/122 |
| 2006/0096741 | A1 * | 5/2006 | Hegde | H01L 23/467 257/E23.099 |
| 2006/0173344 | A1 * | 8/2006 | Marian | F28D 15/0275 600/459 |
| 2006/0185820 | A1 * | 8/2006 | Chen | H01L 23/3677 257/E23.105 |
| 2007/0204972 | A1 * | 9/2007 | Edward | F28F 3/022 361/705 |
| 2008/0080137 | A1 * | 4/2008 | Otsuki | H01L 23/467 257/E23.099 |

(Continued)

*Primary Examiner* — Claire E Rojohn, III

(74) *Attorney, Agent, or Firm* — Shuttleworth & Ingersoll, PLC; Jason R. Sytsma

(57) ABSTRACT

Heatsink has a plurality of cross-connected pathways that create areas of turbulent airflow which is useful for quickly dissipating heat in the heatsink. The cross-connected pathways can include vertically extending pathways that extend from the baseplate to the top surface of the single piece of material with an increasing volume away from the baseplate toward the top surface of the single piece of material and horizontally extending pathways are oriented in a plurality of rows where a diameter of the horizontally extending pathways increases in each row of the plurality of rows from the baseplate.

21 Claims, 4 Drawing Sheets

(56) References Cited

U.S. PATENT DOCUMENTS

| | | | |
|---|---|---|---|
| 2008/0202502 A1* | 8/2008 | Eckhardt | F24C 3/04 |
| | | | 165/104.31 |
| 2009/0263232 A1* | 10/2009 | Jarrah | F04D 29/444 |
| | | | 415/4.4 |
| 2009/0266514 A1* | 10/2009 | Agostini | F28D 15/0233 |
| | | | 29/890.03 |
| 2010/0100090 A1* | 4/2010 | Rose | A61B 18/02 |
| | | | 165/181 |
| 2010/0177480 A1* | 7/2010 | Koplow | H01L 23/467 |
| | | | 165/104.34 |
| 2011/0103011 A1* | 5/2011 | Koplow | H05K 7/20163 |
| | | | 165/185 |
| 2014/0334106 A1* | 11/2014 | Prest | H01L 23/3672 |
| | | | 165/185 |
| 2015/0296662 A1* | 10/2015 | Azar | H05K 7/20 |
| | | | 165/185 |
| 2015/0342085 A1* | 11/2015 | Mckervey | H05K 7/20145 |
| | | | 165/80.3 |
| 2020/0227341 A1* | 7/2020 | Neal | H01L 23/367 |
| 2020/0286812 A1* | 9/2020 | Tochiyama | F28F 3/12 |

* cited by examiner

HEAT DISSIPATION SYSTEM WITH CROSS-CONNECTED HEATSINK

TECHNICAL FIELD

This disclosure directed to a heatsink. More specifically, this disclosure is directed to a heat dissipation system with a plurality of cross-connected pathways.

BACKGROUND

Various types of thermal transfer mechanisms may be employed to cool devices generating heat. Electronic circuits and equipment are one very common application where the electronic heat source is typically a semiconductor die only millimeters in size yet dissipating hundreds of watts. The problem is thus one of transferring the heat from that device to a dissipation sink by some mechanism. In electronic equipment, this is typically done by a metal heatsink and circulating air (either forced or natural convection). Computer modeling applications (such as ANSYS thermal module) can be used to analyze and design a heatsink to help determine the dissipating device temperature as a function of the heatsink physical properties and dimensions, as well as the air volume and temperature. Other means of cooling exist as well, including but not limited to liquid cooling media, heat pipes, and thermoelectric coolers.

A typical heatsink of the prior art is shown in FIG. 1. The prior art heat sink comprises of a metal structure of a defined material, comprised of a baseplate of a design thickness with linear monolithic fins attached to the baseplate with a designed geometry commensurate with the air flow pattern. Most commonly and affordably, the fins are unidirectional linear fins orthogonal to the baseplate, as shown in FIG. 1. Variations in the heatsink material, baseplate geometry, and fin geometry determine the temperature difference from the dissipating device to the cooling medium as a function of the thermal transfer device (heatsink), most commonly referred to as the thermal resistance, which can be expressed in degrees/watt for a stated air temperature and flow rate/volume, or the thermal conductivity, which can be expressed in watts/(meter-Kelvin) for a state air temperature and flow rate/volume.

The materials used for heatsinks ideally have the highest possible thermal conductivity. Most often, aluminum with a thermal conductivity of approximately 230 W/m-K is used both for low cost and ease of manufacturing fabrication. Copper is the first material of preference, with a thermal conductivity of approximately 390 W/m-K, but is used only where the superior thermal conductivity is required to justify the added expense, weight, and fabrication difficulty. Diamond is the best-known heat transfer element, with a thermal conductivity of over 3000 W/m-K. Due to its expense and fabrication issues, it is typically used only as thin wafers attached to a larger metal heatsink to more rapidly transfer heat away from a small heat source to the larger heatsink, e.g., as a "heat spreader".

Heatsinks are usually constructed from a monolithic piece of material, because joining multiple pieces of like or differing material adds a series thermal resistance due to the joining material/physics. This has the effect of degrading heatsink performance compared to one fabricated from a monolithic piece of the same material.

Many variations on the standard linear finned heatsink are known in the industry, the most popular alternative being the pin fin heatsink as shown in FIG. 2. It also is comprised of a baseplate and fins, but in this case, the fins are actually a large plurality of pins of varying geometrical cross section and density and nominally orthogonal to the baseplate although variations with angled or "splayed" pins are also available.

The thermal transfer efficiency is the key indicator of heatsink performance. Normally thermal resistance is used as a benchmark. There can be a significant difference in thermal resistance, on the order of almost 4:1 between a pin fin and linear fin heatsink, and 2:1 between an aluminum and copper pin fin heatsink, for equal baseplate areas. A copper pin fin heatsink thus has approximately an 8:1 improvement in the thermal transfer over a linear finned aluminum heatsink due to the material and geometry differences.

While different materials and geometries may produce widely variation thermal transfer efficiencies, the cost of implementation for a particular material and geometry must also be considered. The manufacturing cost of the heatsink is a prime consideration of such devices and their use in products.

Aluminum linear fin heatsinks are normally extruded, allowing very low-cost manufacture using proven traditional extrusion technology. This technique is used for the majority of heatsinks used. Secondarily, more complex heatsinks are easily machined using conventional low-cost CNC milling technology where extrusion is not feasible. Aluminum is known for its ease of machining. Another alternative is casting of aluminum heatsinks, which is a very low-cost alternative fabrication method where manufacturing volumes are high enough to amortize the large cost of molds.

Copper linear heatsinks may be machined using CNC technology, but copper is known for its difficulty in machining, more specifically, it is soft and "sticky" properties which quickly dull machine tools and slow cutting rates. Thus a copper heatsink is expensive to manufacture and is only used where absolutely necessary. Copper is virtually impossible to extrude in structural shapes or to cast, and thus those techniques are unavailable. However, cold forging has been successfully used to manufacture copper pin fin heatsinks, but is limited in physical size and fineness of geometry by the forging process and copper properties, in addition to the high capital cost of forging.

What is need is a heatsink design that is comparable in efficiency to a pin fin heatsink, but can be manufactured using low-cost manufacturing technology.

SUMMARY

Disclosed is a thermal heatsink comprising a single piece of material. The heatsink has a plurality of cross-connected pathways that create areas of turbulent airflow which is useful for quickly dissipating heat in the heatsink. The cross-connected pathways can include vertically extending pathways that extend from the baseplate to the top surface of the single piece of material with an increasing volume away from the baseplate toward the top surface of the single piece of material. The cross-connected pathways can include horizontally extending pathways are oriented in a plurality of rows where a diameter of the horizontally extending pathways increases in each row of the plurality of rows from the baseplate. The heatsink can have a baseplate at a bottom of the single piece of material with a bottom surface adapted to be placed in thermal contact with a heat-generating device.

The thermal heatsink can be combined with an air chamber positioned between the single piece of material and the fan to form a heat dissipation system for providing an area of equal air pressure into the plurality of cross-connected pathways. The air chamber can have an interior area adjacent to a top surface of the single piece of material that is substantially equal to an outlet area of the vertically extending pathways. A fan can be provided with an internal area of space adjacent to the air chamber that is substantially equal to the interior area of the air chamber.

In an embodiment, the heatsink can comprise a plurality of pathways extending from the baseplate and a plurality of pathways extending across the baseplate that intersect with the plurality of pathways extending from the baseplate. The pathways extending from the baseplate can be orthogonal to the baseplate or at an angle with respect to the baseplate. The pathways extending across the baseplate can be parallel with the baseplate or at an angle with respect thereto. The baseplate can have a thickness alpha that depends on the desired design specifications. The baseplate should be thick enough to provide a low resistance path for heated air away from the heat source. In one embodiment, the plurality of pathways orthogonal to the baseplate can extend from the baseplate without extending through the baseplate to a top of the single piece of material. These dimensions can be varied depending on the design requirements.

BRIEF DESCRIPTION OF THE DRAWINGS

These and other features and advantages of the present invention will be better understood by reading the following detailed description, taken together with the drawings wherein.

DETAILED DESCRIPTION

Figure 4:
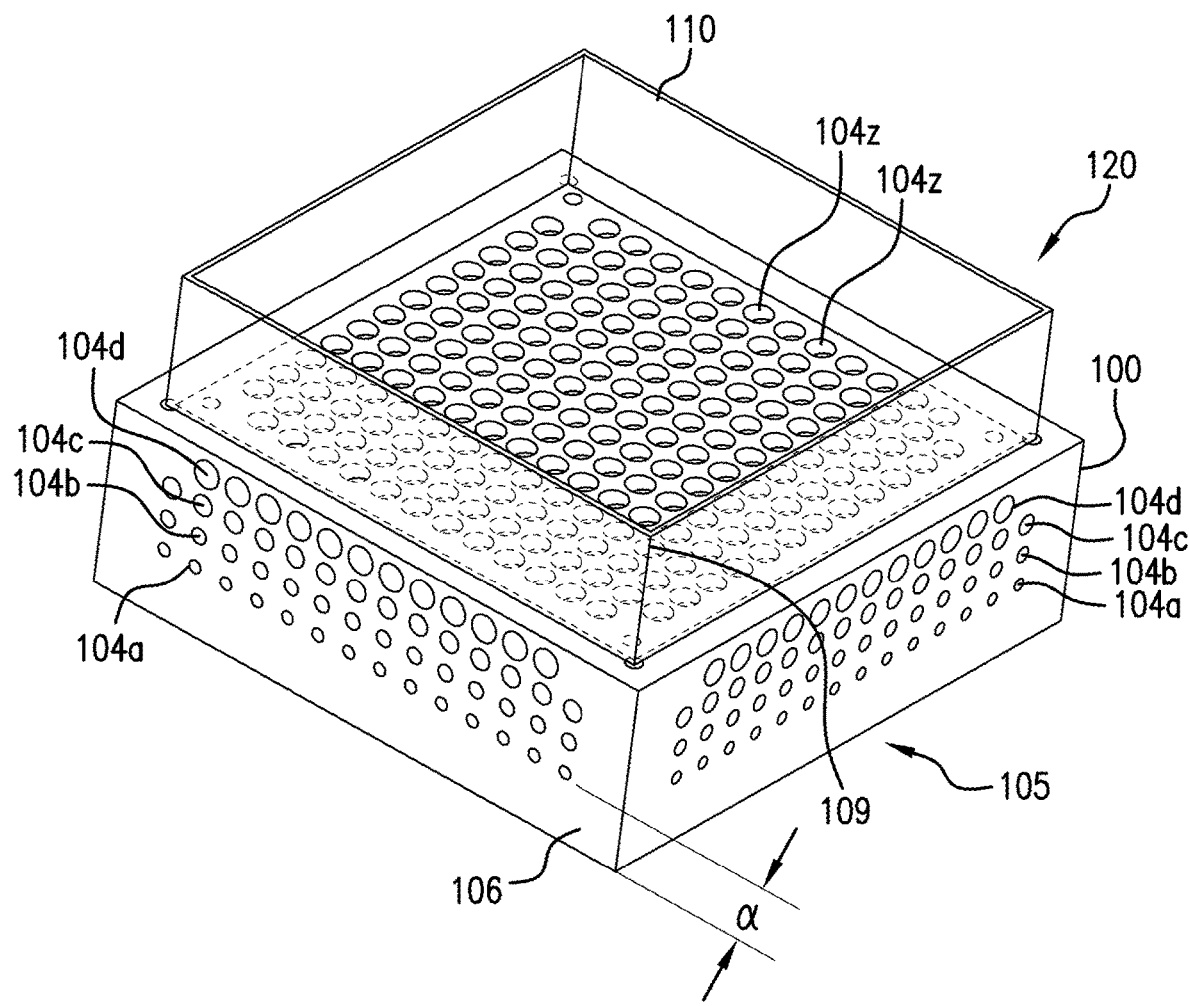
FIG. 4 is a perspective view of a heatsink in accordance with the present disclosure.
Figure 5:
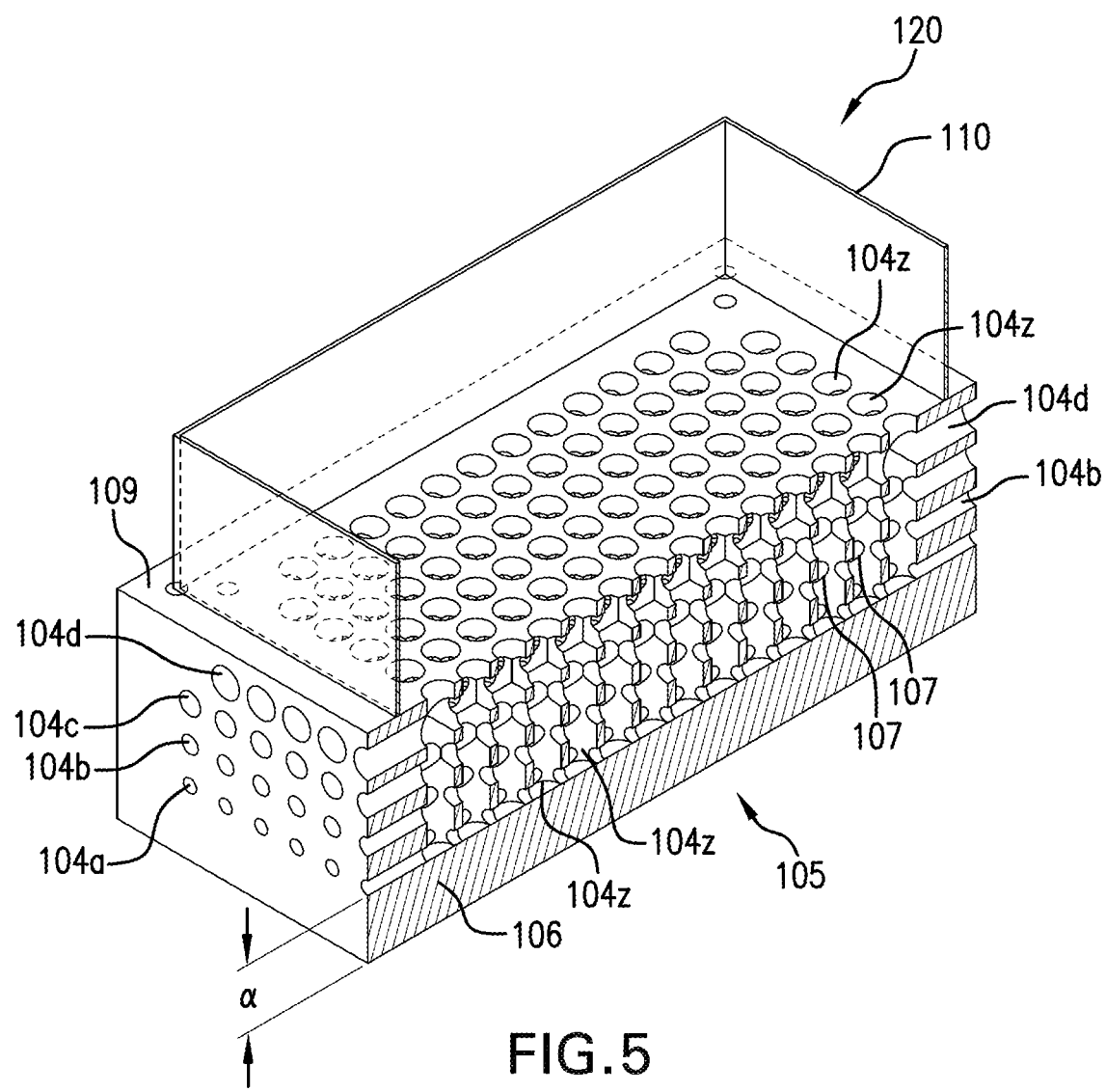
FIG. 5 is a cross-sectional view of the heatsink of FIG. 4.
Figure 6:
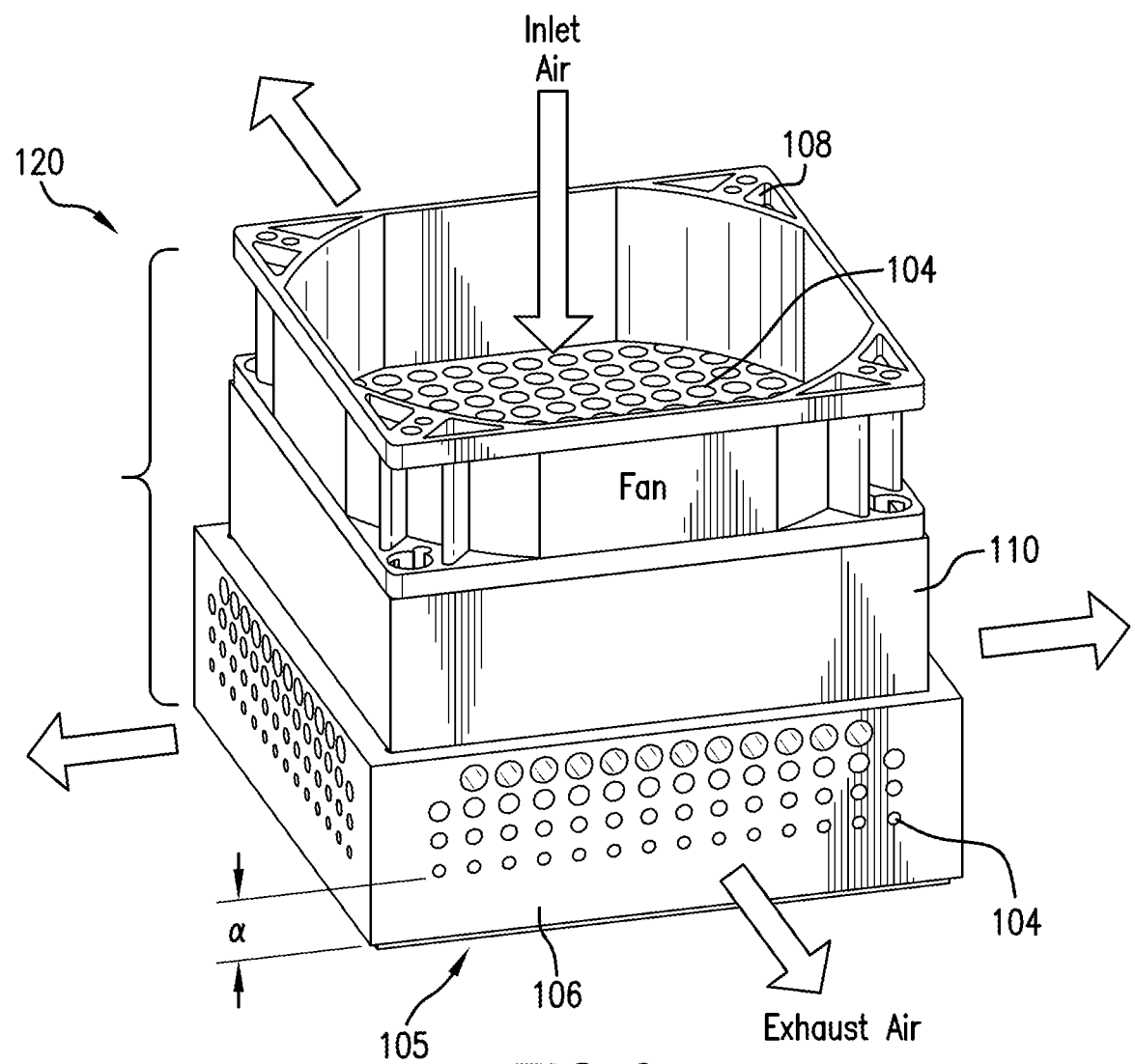
FIG. 6 is a heatsink assembly in accordance with this disclosure showing a pattern of air flow through the heatsink of FIG. 4.

With reference now to FIG. 6, a perspective view of a heat dissipation system 120 that comprises a thermal heatsink 100 in accordance with the present disclosure, a fan 108 and an air chamber 110 positioned in between the two. Heat dissipation system 120 is shown in FIGS. 4 and 5 without fan 108. Heat dissipation system 120 efficiently dissipates heat by using an air chamber 110 between fan 108 and heatsink 100 to create a volume of space that equalizes the air pressure of the air that is being blown into the pathways of heatsink 100.

In the present disclosure, heatsink 100 comprises of a single piece of material 102. Single piece of material 102 has a plurality of cross-connected pathways 104, which creates turbulent airflow therein to quickly dissipate heat. Heatsink 100 is adapted to have a bottom surface 105 placed in thermal contact with a heat-generating device, such as an integrated circuit, power supply, etc. A thermally conductive layer of bonding material can be used to thermally couple a top surface of the heat generating device to bottom surface 105 of heatsink 100. Although heatsink 100 and the heat generating device can be thermally coupled as described above, heatsink 100 is also well suited to various other approaches for coupling to a heat generating device.

As shown in FIGS. 4 and 5, plurality of cross-connected pathways 104 can comprise horizontally extending pathways 104a-104d oriented in a plurality of rows where a diameter of the horizontally extending pathways 104a-104d increase in each row of the plurality of rows vertically upward from baseplate 106. Horizontally extending pathways 104a-104d with diameters increasing upward creates vertically extending pathways 104z with an increasing volume away from the baseplate 106 toward top surface 109 of the single piece of material 102 which opens into air chamber 110. In essence, this creates vertically extending pathways 104z having the cross-section of a funnel that is wide at the top and narrow at the bottom.

The volumetrically increasing vertically extending pathways 104z allows with smaller surface areas at the bottom of heatsink 100 than at top surface 109 causes the heat to rise upward more quickly due to the increasing upward surface area of vertically extending pathways 104z.

The holes that are bored to form pathways 104 can be bored in three planes, although it will be obvious to one skilled in the art that fewer or added planes of bored holes or non-linear geometries may be advantageous in other implementations. The bored holes of each plane intersect with the bored holes of the other planes, resulting in a complex pattern of pathways 104 permeating single piece of material 102.

Figure 1:
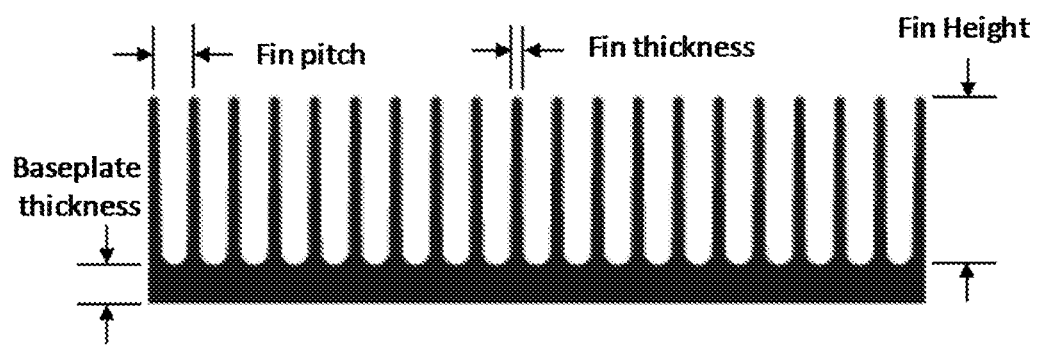
FIG. 1 is a perspective view of a prior art heat finned heatsink.
Figure 2:
FIG. 2 is a top view of a prior art pin fin heatsink.
Figure 3:
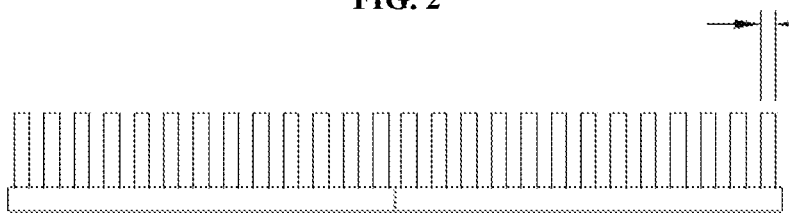
FIG. 3 is a side view of the pin fin heatsink of FIG. 2.

With reference still to FIG. 3, in the present embodiment, cross-connected pathways 104 can extend in multiple directions and three dimensions across single piece of material 102. In the illustrated embodiment, cross-connected pathways 104 further comprises a plurality of pathways 104 orthogonal to a baseplate 106 and a plurality of pathways 104 parallel to baseplate 106 that intersect with plurality of pathways 104 orthogonal to baseplate 106. FIG. 4 shows how pathways 104 cross-connect inside single piece of material 102. Pathways 104 can also be asymmetrical in shape and size.

Baseplate 106 can be integral with single piece of material 102 and can have a thickness alpha across an area that is in contact with the heat generating device. The thickness of alpha can vary on the low end to where alpha is equal to the wall thickness of pathways 104, or that is greater than or equal to a thickness of a wall between adjacent pathways 104, but can be much thicker. Baseplate 106 should be thick enough to provide a low resistance path for heat being conducted away from the heat source, i.e., the greater the thickness the greater the thermal efficiency. Thickness alpha of baseplate 106 partially determines the temperature difference from the dissipating device to the cooling medium (i.e. the thermal resistance). Increasing thickness alpha increases the thermal resistance of heatsink 100. But, thickness of baseplate 106 also increases the weight and cost of single piece of material 102. So, the designer can exercise judgement in determining the thickness of baseplate 106.

Single piece of material 102 can be configured with any shape or dimensions. The illustrated embodiment shows single piece of material 102 as rectilinear with the holes forming pathways 104 bored from five surfaces. The holes can be bored from each of opposite surfaces to meet in the center of single piece of material 102, which can be done much faster and more precise than boring a single hole completely through single piece of material 102. Furthermore, the illustrated embodiment has a plurality of pathways 104 orthogonal to baseplate 106, but not penetrating bottom surface 105 of baseplate 106, although the bores could also penetrate if so desired.

Air can be forced through pathways 104 of one or more surfaces, with the air exiting from the surfaces where air is not being injected. As shown in FIG. 6, heatsink 100 can have a fan 108 (the fan blades are removed to better show the airflow) that blows air orthogonally toward bottom surface 105 of baseplate 106 from a top surface 109 of the heatsink 100. Air exhausts from four other faces of heatsink 100 (as shown by the exit arrows) dissipating heat from the component(s) mounted to bottom surface 105 of baseplate 106.

Air chamber 110 between heatsink 100 and fan 108 creates a volume of space to equalize the air pressure of air that is forced into vertically extending pathways 104z. The decreasing volume of vertically extending pathways 104z causes the air to speed up as it travels downward toward the source of the heat, which increase the dissipation of the heat from heatsink 100.

Heat dissipation system 120 is design to take advantage of the venturi effect. This is the principal that static pressure decrease when the area decreases. Air is blown from fan 108 into air chamber 110 and into vertically extending pathways 104z of heatsink 100. The overall cross-sectional area of outlet of fan 108 is designed to be substantially equal to the cross-sectional area of the sum of the inlets to vertically extending pathways 104z and substantially equal to air outlet of air chamber 110. By keeping these cross-sectional areas substantially the same the pressures are substantially the same with only air pressure decreasing and air speed increasing inside vertically extending pathways 104z. This means that all vertically extending pathways 104z are working together to dissipate an generally equal amount of air to increase the efficiency and performance of heatsink 100.

The turbulence of the airflow through the complex pattern of pathways 104, combined with the total wall area of pathways 104 determines the heat transfer efficiency to the circulating air medium. When air is directed onto heatsink 100, the air will flow down and outward with areas of turbulence in areas 107 where pathways 104 intersect. Areas 107 of turbulence are shown in the cross-sectional view of heatsink 100 of FIG. 5.

Thermal analysis of heatsink 100 with cross-connected pathways 104 has shown the efficiency to be approximately equal to that of a copper pin fin heatsink, without the capital cost and physical limitations of the forging. That means that heatsink 100 with cross-connected pathways 104 can be manufactured with conventional cost-effective CNC fabrication techniques. As with the conventional pin fin or linear fin heatsinks, the designer may alter the geometry to trade off the thermal efficiency and fabrication cost. In the case of heatsink 100, the number of pathways 104, specific axes of pathways 104, the geometry, the spacing between pathways 104 and regularity in dispersion, and diameter/cross-section may be varied to achieve a particular design performance. Other variations may be applied as well by one skilled in the art. It is equally obvious that the cross-drilled heatsink may be used to advantage with thermal transfer media other than air, i.e., fluids.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A thermal heatsink system comprising:
   a single piece of material comprising a plurality of cross-connected bored holes each with an interrupted sidewall in the single piece of material for creating surface area for dissipating heat;
   a fan for dissipating heat on the single piece of material; and
   an air chamber positioned between the single piece of material and the fan for providing an area of equal air pressure into the plurality of cross-connected bored holes.

2. The thermal heatsink of claim 1, wherein the single piece of material further comprises a baseplate at a bottom of the single piece of material with a bottom surface adapted to be placed in thermal contact with a heat generating device; and wherein the plurality of cross-connected bored holes comprises of vertically extending bored holes comprising cylindrical inner walls that extend from the baseplate to a top surface of the single piece of material and horizontally extending bored holes comprising cylindrical inner walls that extend across opposite sides of the single piece of material.

3. The thermal heatsink of claim 2, wherein the horizontally extending bored holes are oriented in a plurality of rows where a diameter of the horizontally extending bored holes increases in each row of the plurality of rows from the baseplate.

4. The thermal heatsink of claim 3, wherein the vertically extending bored holes each have an increasing volume away from the baseplate toward the top surface of the single piece of material which opens into the air chamber.

5. The thermal heatsink of claim 4, wherein the air chamber has an interior area adjacent to a top surface of the single piece of material that is substantially equal to an outlet area of the vertically extending bored holes.

6. The thermal heatsink of claim 5, wherein the fan has an internal area of space adjacent to the air chamber that is substantially equal to the interior area of the air chamber.

7. The thermal heatsink of claim 1, and further comprising a plurality of bored holes comprising cylindrical inner walls extending across the single piece of material with an opening on each side of the bored holes on opposing sides of the single piece of material, wherein the plurality of bored holes intersect with the plurality of bored holes extending from a baseplate.

8. The thermal heatsink of claim 7, wherein the plurality of bored holes extending across the single piece of material are parallel to the baseplate.

9. The thermal heatsink of claim 8, wherein the baseplate has a thickness alpha that is greater than or equal to a thickness of a wall between adjacent bored holes.

10. The thermal heatsink of claim 9, wherein the plurality of cross-connected bored holes further comprise a plurality of bored holes orthogonal to the baseplate that extend from the baseplate without extending through the baseplate to a top of the single piece of material.

11. The thermal heatsink of claim 1, wherein the single piece of material is copper.

12. The thermal heatsink of claim 1, wherein the plurality of cross-connected bored holes are asymmetrical in shape and size.

13. A thermal heatsink comprising:
a single piece of material comprising a baseplate;
a top surface on a side opposite the baseplate;
vertically extending bored holes each with an interrupted sidewall that extend from the baseplate to the top surface of the single piece of material; and
horizontally extending bored holes cross-connected with the vertically extending bored holes and each with an interrupted sidewall that extend across opposite sides of the single piece of material and are oriented in a plurality of rows where a diameter of the horizontally extending bored holes increases in each row of the plurality of rows from the baseplate.

14. The thermal heatsink of claim 13, wherein the vertically extending bored holes each have an increasing volume away from the baseplate toward the top surface of the single piece of material which opens into the air chamber.

15. The thermal heatsink of claim 13, and further comprising a baseplate at a bottom of the single piece of material with a bottom surface adapted to be placed in thermal contact with a heat generating device.

16. The thermal heatsink of claim 13, and further comprising a baseplate and a plurality of bored holes extending from the baseplate and having an opening on a top surface of the single piece of material.

17. The thermal heatsink of claim 13, and further comprising a baseplate, wherein a portion of the plurality of bored holes extend orthogonal from the baseplate.

18. The thermal heatsink of claim 13, and further comprising a baseplate, wherein a portion of the plurality of bored holes extend across the single piece of material parallel to the baseplate each of the portion of the plurality of bored holes that extend across the single piece of material comprises of an opening on opposite sides of the single piece of material.

19. The thermal heatsink of claim 18, and further comprising a baseplate, wherein a portion of the plurality of bored holes extend across the single piece of material and parallel to the baseplate.

20. A thermal heatsink comprising:
a single piece of material comprising a baseplate;
a top surface on a side opposite the baseplate;
vertically extending bored holes each with an interrupted sidewall that extend from the baseplate to the top surface of the single piece of material and each have a consistently increasing volume away from the baseplate toward the top surface of the single piece of material; and
horizontally extending bored holes cross-connected with the vertically extending bored holes and each with an interrupted sidewall that extend across opposite sides of the single piece of material.

21. The thermal heatsink of claim 20, wherein the horizontally extending bored holes are oriented in a plurality of rows where a diameter of the horizontally extending bored holes increases in each row of the plurality of rows from the baseplate.

* * * * *